(12) United States Patent
Xie et al.

(10) Patent No.: US 9,831,906 B1
(45) Date of Patent: Nov. 28, 2017

(54) ACTIVE ELECTRONICALLY SCANNED ARRAY WITH POWER AMPLIFIER DRAIN BIAS TAPERING

(71) Applicant: Rockwell Collins, Inc., Cedar Rapids, IA (US)

(72) Inventors: Chenggang Xie, Marion, IA (US); James B. West, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 485 days.

(21) Appl. No.: 14/607,878

(22) Filed: Jan. 28, 2015

(51) Int. Cl.
  *H04B 1/40* (2015.01)
  *H03F 1/02* (2006.01)
  *H03F 3/19* (2006.01)
  *H03F 3/24* (2006.01)
  *H04B 1/04* (2006.01)

(52) U.S. Cl.
  CPC .............. *H04B 1/40* (2013.01); *H03F 1/0205* (2013.01); *H03F 3/19* (2013.01); *H03F 3/245* (2013.01); *H03F 2200/12* (2013.01); *H03F 2200/451* (2013.01); *H03F 2203/21106* (2013.01); *H04B 2001/045* (2013.01)

(58) Field of Classification Search
  CPC ....... H04B 1/40; H04B 2001/045; H03F 3/19; H03F 1/0205; H03F 3/245; H03F 2203/21106; H03F 2200/451; H03F 2200/12
  See application file for complete search history.

(56) References Cited

U.S. PATENT DOCUMENTS

| | | | | |
|---|---|---|---|---|
| 5,945,941 A * | 8/1999 | Rich, III | ............... | G01S 7/282 330/297 |
| 6,005,531 A * | 12/1999 | Cassen | ............... | H01Q 21/064 343/700 MS |
| 7,511,664 B1 * | 3/2009 | Mason | ............... | H01Q 1/02 342/372 |
| 8,334,809 B2 * | 12/2012 | Nichols | ............... | H01Q 1/3275 343/700 MS |
| 8,903,342 B1 | 12/2014 | Wyse et al. | | |
| 9,137,067 B1 * | 9/2015 | Xie | ............... | H04L 27/20 |
| 9,490,756 B1 * | 11/2016 | Babic | ............... | H03F 1/56 |
| 9,548,731 B2 * | 1/2017 | Shah | ............... | H01L 29/778 |
| 9,667,197 B2 * | 5/2017 | Garrec | ............... | H03F 1/0288 |
| 9,673,846 B2 * | 6/2017 | Hageman | ............... | H04B 1/0475 |
| 9,705,611 B1 * | 7/2017 | West | ............... | H04B 17/12 |
| 2004/0150554 A1 * | 8/2004 | Stenger | ............... | H01P 1/047 342/175 |

(Continued)

OTHER PUBLICATIONS

E. Brookner, "Active electronically scanned array (AESA) system noise temperature," 2013 IEEE International Symposium on Phased Array Systems and Technology, Waltham, MA, 2013, pp. 760-767.*

(Continued)

*Primary Examiner* — John B Sotomayor
(74) *Attorney, Agent, or Firm* — Angel N. Gerdzhikov; Donna P. Suchy; Daniel M. Barbieri

(57) ABSTRACT

An active electronically scanned array (AESA) includes a plurality of power amplifiers including first power amplifiers and second power amplifiers. The first power amplifiers are biased by a first drain voltage. The second power amplifiers are biased by a second drain voltage. The second drain voltage is different from the first drain voltage.

19 Claims, 11 Drawing Sheets

(56) References Cited

U.S. PATENT DOCUMENTS

| | | | | |
|---|---|---|---|---|
| 2005/0046607 A1* | 3/2005 | Volman | ................ | G01S 13/282 |
| | | | | 342/109 |
| 2005/0146479 A1* | 7/2005 | Stenger | ................. | H01P 1/047 |
| | | | | 343/772 |
| 2006/0055599 A1* | 3/2006 | McIntire | ............ | H01Q 21/0093 |
| | | | | 342/368 |
| 2012/0142280 A1* | 6/2012 | Banu | .................... | H04B 7/0682 |
| | | | | 455/69 |
| 2012/0194406 A1* | 8/2012 | Brown | .................... | H01Q 5/42 |
| | | | | 343/876 |
| 2016/0373106 A1* | 12/2016 | Shah | ................... | H01L 27/0207 |
| 2017/0005416 A1* | 1/2017 | Gendron | ................ | H01Q 1/38 |

OTHER PUBLICATIONS

R. Popovich, "Receiver protection considerations for T/R modules employed in AESA systems," 2008 IEEE International Conference on Microwaves, Communications, Antennas and Electronic Systems, Tel-Aviv, 2008, pp. 1-4.*

N. V. Zhuchkova, "Multi-channel transmit/receive modules for X-band AESA," 2013 IX Internatioal Conference on Antenna Theory and Techniques, Odessa, 2013, pp. 506-508.*

* cited by examiner

ACTIVE ELECTRONICALLY SCANNED ARRAY WITH POWER AMPLIFIER DRAIN BIAS TAPERING

CROSS-REFERENCE TO RELATED APPLICATIONS

The present application is related to U.S. patent application Ser. No. 13/714,209, filed on Dec. 13, 2012; the present application is related to U.S. patent application Ser. No. 13/737,777, filed on Jan. 9, 2013, which issued as U.S. Pat. No. 8,903,342 on Dec. 2, 2014; the present application is related to U.S. patent application Ser. No. 13/837,934, filed on Mar. 15, 2013; the present application is related to U.S. patent application Ser. No. 14/206,632, filed on Mar. 12, 2014; the present application is related to U.S. patent application Ser. No. 14/030,557, filed on Sep. 18, 2013; the present application is related to U.S. patent application Ser. No. 14/136,440, filed on Dec. 20, 2013.

U.S. patent application Ser. Nos. 13/714,209, 13/737,777, 13/837,934, 14/206,632, 14/030,557, and 14/136,440 and U.S. Pat. No. 8,903,342 are herein incorporated by reference in their entirety.

FIELD

Embodiments of the inventive concepts disclosed herein are directed generally toward electronically scanned arrays, and more specifically to active electronically scanned arrays.

BACKGROUND

Active electronically scanned arrays (AESA, also known as phased array antennas) require phase shift for beam pointing. AESAs typically require amplitude taper to achieve low side lobe levels (SLLs). Currently, quantization in the power output of power amplifier modules creates aperture amplitude excitation errors. Precise aperture phase and amplitude control are required for high performance AESAs. Errors in phase or amplitude cause corruption in the radiation pattern.

There has been a long-felt and persistent need, which has been unsolved by others, for removing periodic (e.g., deterministic) phase error, random amplitude error, and other phase errors from the phase shifters that are required to steer radiation beams in AESAs. Peak and root mean square phase and amplitude errors degrade AESA system parameters. For example, periodic errors on the aperture cause undesirable peak periodic side lobe levels, and root mean square random errors increase overall average side lobe level noise. Further, amplitude quantization in the aperture excitation produces undesirable deterministic peak side lobe levels in the AESA's far field radiation pattern.

Currently, transmit/receive active electronically scanned arrays (AESAs) utilize uniform illumination in transmit mode with identical power amplifier modules operated in saturation (i.e., conversion of direct current (DC) to maximum radio frequency (RF) power) to achieve the currently best available power added efficiency, and the identical power amplifiers are operated in the same manner throughout the aperture. AESAs, however, would benefit from low side lobe level transmit patterns. For example, modern radar systems require 2-way side lobe levels of −50 dBc (i.e., decibels relative to the carrier), where 2-way side lobe level (in dBc) equals receive side lobe levels plus transmit side lobe levels. Currently, uniformly illuminated rectangular (e.g., square or rectangular) contoured transmit apertures only have −13.5 dB side lobe levels in the principal E and H planes, and circular and elliptical contoured apertures only have −17 dB side lobe levels in the principal E and H planes; such side lobe levels in the transmit pattern requires ultra-low (and difficult to realize) side lobe levels in the receive pattern to achieve the currently required −50 dBc 2-way side lobe levels.

Side lobe level is an important performance requirement for AESAs. Typically, the first side lobe level is 13.5 dB below the peak of the main beam when operating with uniform illumination; however, in some applications, lower side lobe levels are required. One scheme currently used to reduce side lobe levels is to taper the radiated power from each element across the AESA such that the elements in the middle of the AESA are radiated with the highest power and the rest of the elements are symmetrically tapered. Currently, tapering the output power is achieved by feeding each transmitter with different RF power input levels; however, the transmitter efficiency drops significantly as the power amplifier output power is backed off from the peak power. Additionally, a common approach to taper output power is to use different transmit/receive modules with each transmit/receive module designed for a different peak power. In such an approach, each of the transmitters is operated at saturation for maximum efficiency but also operated at different power levels. For example, if three different power levels are needed across the AESA, the AESA is implemented with three different transmit/receive module types, each with different transmitted powers; however, this requires three times as any many parts, which significantly increases both recurring and non-recurring costs for the AESA.

Therefore, it would be desirable to provide a method, apparatus, and system which achieves power tapering across the AESA, achieves high power added efficiency, and reduces power amplifier amplitude quantization, which in turn reduces deterministic peak side lobe levels in the AESA's far field radiation pattern.

SUMMARY

In one aspect, embodiments of the inventive concepts disclosed herein are directed to an active electronically scanned array (AESA). The AESA includes a plurality of power amplifiers including first power amplifiers and second power amplifiers. The first power amplifiers are biased by a first drain voltage. The second power amplifiers are biased by a second drain voltage. The second drain voltage is different from the first drain voltage.

In an additional aspect, embodiments of the inventive concepts disclosed herein are directed to a method for operating an active electronically scanned array. The method includes applying a first bias drain voltage to first power amplifiers of the active electronically scanned array. The method also includes applying a second bias drain voltage to second power amplifiers of the active electronically scanned array. The first bias drain voltage is different from the second bias drain voltage.

In a further aspect, embodiments of the inventive concepts disclosed herein are directed to a system. The system includes a plurality of transmit/receive modules including first transmit/receive modules and second transmit/receive modules. Each first transmit/receive module includes a first power amplifier and a first transmit/receive (T/R) radio frequency integrated circuit (RFIC). The first T/R RFIC is coupled with the first power amplifier and configured to control a first bias drain voltage applied to the first power amplifier. Each second transmit/receive module includes a second power amplifier and a second T/R RFIC. The second T/R RFIC is coupled with the second power amplifier and configured to control a second bias drain voltage applied to the second power amplifier. The first bias drain voltage is different from the second bias drain voltage.

Additional embodiments are described in the application including the claims. It is to be understood that both the foregoing general description and the following detailed description are exemplary and explanatory only and are not restrictive. Other embodiments of the invention will become apparent.

BRIEF DESCRIPTION OF THE FIGURES

Other embodiments will become apparent by reference to the accompanying figures in which.

DETAILED DESCRIPTION

Figure 1:
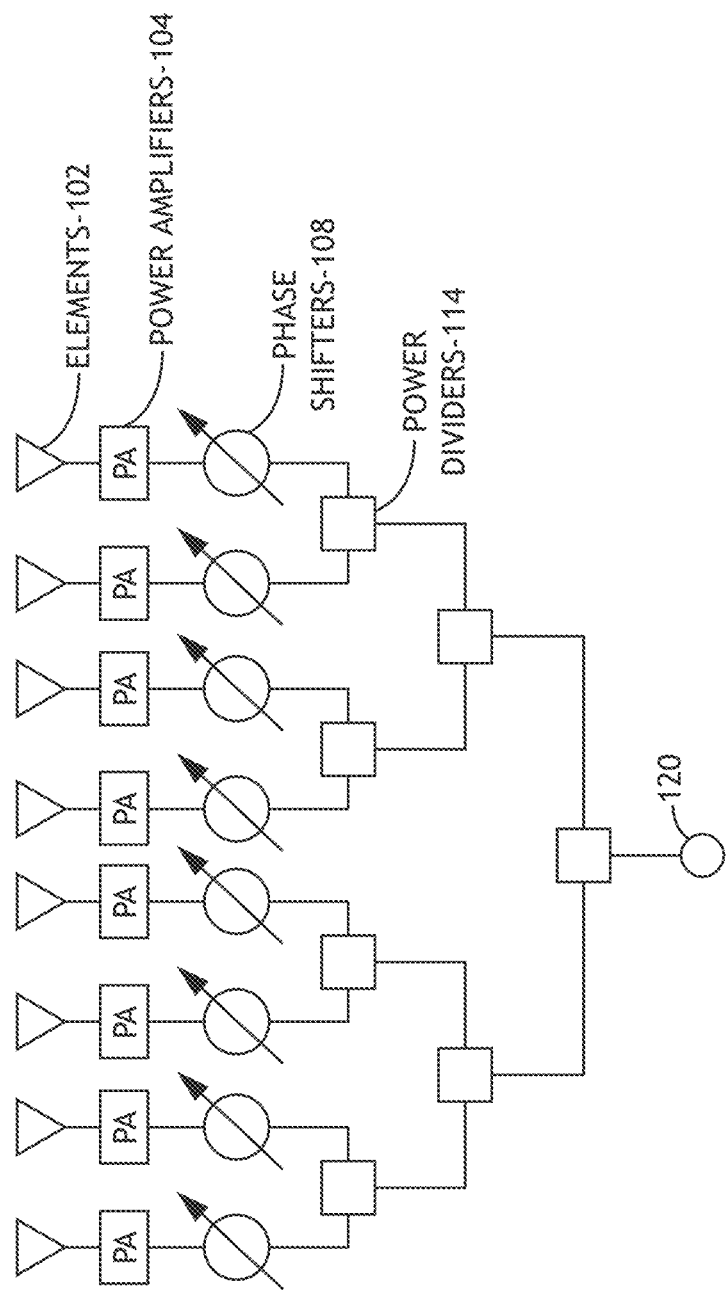
FIG. 1 shows a schematic illustration of a group of radiating elements suitable for use in an AESA of some embodiments.

Reference will now be made in detail to the subject matter disclosed, which is illustrated in the accompanying drawings. The scope is limited only by the claims; numerous alternatives, modifications, and equivalents are encompassed. For the purpose of clarity, technical material that is known in the technical fields related to the embodiments has not been described in detail to avoid unnecessarily obscuring the description.

Some embodiments include implementing an active electronically scanned array (AESA) with tapering of bias drain voltages applied to one or more power amplifiers of or associated with transmit/receive modules such that identical (e.g., a single design or type) power amplifiers (e.g., a power amplifiers implemented within a transmit/receive module) are utilized across the AESA. In some embodiments, groups of power amplifiers of the AESA are biased with different drain voltages such that the transmitted output power is tapered across the AESA. In one embodiment, each power amplifier of the AESA is identical, and each identical power amplifier is configured to receive the same peak power level. In another embodiment, an AESA may be implemented with different groups of power amplifiers with each group having a distinctly configured power amplifier from the other group(s) of power amplifiers; in such an embodiment, the power amplifiers of different groups of power amplifiers are configured to receive different peak power levels while power amplifiers of a particular group are configured to receive a common (e.g., the same) peak power level. Further, in some embodiments, an AESA includes groups of transmit/receive modules with each transmit/receive module including one or more power amplifiers, wherein the power amplifiers of a particular group of transmit/receive modules are biased by a particular drain voltage and the power amplifiers for all of the groups of transmit/receive modules are configured to receive less than or equal to an identical peak power level. Further, in some embodiments, an AESA includes groups of transmit/receive modules with each transmit receive module including one or more (e.g., one, two, three, four, . . . eight, or more) power amplifiers, wherein the power amplifiers of a particular group of transmit/receive modules are biased by a particular drain voltage and configured to receive less than or equal to a particular peak power level.

Some embodiments reduce (e.g., minimize, negate, eliminate, or the like) the need for the use of different power amplifier modules throughout an AESA to realize low side lobe level transmit operations. Some embodiments include adjusting the power output of AESA radiating element-level power amplifiers to prevent amplitude quantization-based (e.g., deterministic error) induced high side lobe levels in the AESA's radiation pattern as a function of scan. In some embodiments, the power amplifier design allows for analog power tapering by utilizing drain bias voltage tapering. In some embodiments, drain bias voltage tapering includes utilizing input power adjustment to the power amplifiers and drain bias voltage adjustment to achieve analog transmitted power output tapering over a 13 dB range while maintaining input/output (I/O) RF port impedance match. Some embodiments are configured to perform real-time transmit AESA radiation pattern synthesis (e.g., beam shaping) through dynamic power amplifier power output adjustment.

Some embodiments may be implemented in AESA-based multi-function weather radar systems (e.g., next-generation commercial AESA-based multi-function weather radar systems). Some embodiments may be implemented in government radar systems, such as radar systems for maritime surveillance, unmanned aerial system (UAS) detect and avoid, maritime rotary wing search and rescue, degraded visual environment (DVE) imaging, syntehetic aperture radar (SAR), inverse synthetic aperture radar (ISAR), and frequency modulated continuous wave radar (FMCW radar). Some embodiments may be implemented in government high data rate directional data link systems, such as for man packs, ground vehicles, maritime use, airborne use, satellite communications on the move (SOTM), or special operations. Some embodiments may be implemented in government electronic attack systems, such as ultra-wide band (UWB) electronic attack (EA) jammers. Some embodiments may be implemented in government anti-access area denial (A2AD) burn through jammer AESAs. Some embodiments may be implemented in any of suitable bandwidth AESA applications, such as narrow bandwidth, mid bandwidth, or wider bandwidth AESA applications (e.g., ultra-wide band radar applications).

Referring now to FIG. 1, a schematic illustration is shown of a group (e.g., a row, as shown) of radiating elements 102 suitable for use in an AESA of some embodiments. As shown, the radiating elements 102 of the AESA may be arranged in rows; however, in other embodiments, the radiating elements 102 of the group of radiating elements may be arranged in any suitable arrangement, such as a ring of radiating elements 102 arranged around another group of radiating elements. The radiating elements 102 may receive a signal from a signal source 120, which generates a radio frequency signal to be emitted from the AESA by radiating elements 102. A power divider network 114 may divide the signal generated by signal source 120 and route the divided signals to radiating elements 102. Coupled between radiating elements 102 and power divider network 114 are phase shifters 108 and power amplifiers 104. The phase shifters 108 may be configured to control the phase of the signals provided to the individual radiating elements 102 by power divider network 114. The power amplifiers 104 may be configured to control the RF transmit power of the signals provided to the individual radiating elements 102 by power divider network 114. In some embodiments, the phase shifters 108 are implemented as separate components or as part of separate components (e.g., implemented within a portion (e.g., a T/R RFIC 811, shown in FIGS. 9-11) of a multi-chip integrated circuit transmit/receive module, which may be coupled to one or more radiating elements 102), which are not shown in FIG. 1. In some embodiments, the power amplifiers 108 are implemented as separate components or as part of separate components (e.g., implemented within at least one portion (e.g., at least one supporting T/R RFIC 812, shown in FIGS. 9-11) of a multi-chip integrated circuit transmit/receive module, which may be coupled to one or more radiating elements 102).

In some embodiments, the AESA architecture shown in FIG. 1 may be implemented as at least one hybrid T/R RF circuit module including multiple individual components, such as GaAs power amplifiers (for example, associated with the transmit side), low noise amplifiers (for example, associated with the receive side), switches, or the like. For example, a hybrid transmit and receive assembly may provide both transmit and receive functionality for each radiating element 102 within an AESA. While a particular portion of an AESA architecture of one embodiment is depicted in FIG. 1, other embodiments may be implemented with any suitable AESA architecture. For example, T/R modules may be implemented as a single type of T/R RFICs (e.g., GaAs T/R RFICs, or other suitable T/R RFICs implemented with any suitable semiconductor material) or a combination of different types of T/R RFICs (e.g., GaAs T/R RFICs and a SiGe T/R RFIC, or any other suitable combination of different types of T/R RFICs implemented with any suitable semiconductor materials), as described in more detail below. Additionally, the T/R modules may be implemented utilizing a single channel or any number of suitable channels, as described in more detail below.

In one embodiment, the radiating elements 102 are separated by a uniform distance; however, in other embodiments, the radiating elements are separated by any of suitable non-uniform distances. The individual signals emitted by radiating elements 102 may combine to form an electronically steerable beam. The power amplifiers 104 may control the amplitudes of their respective signals to control the resulting shape of beam and its side lobes. In some embodiments, signals received via radiating elements 102 may be phase shifted by phase shifters 108 for further processing.

Additionally, in some embodiments for particular applications (e.g., broader bandwidth applications, such as ultra-wide band (UWB) applications), true-time delay units (TDUs) may be substituted for the phase shifters 108. For example, broader bandwidth applications may include UWB electronic attack jammers or other systems requiring UWB transmit capability. Additionally, AESAs suitable for use in UWB applications may include a balanced antipodal Vivaldi array (BAVA), a balanced antipodal asymmetric Vivaldi array, a tapered slot antenna array, a balanced antipodal tapered slot antenna array, or other suitable aperture architecture.

Figure 2:
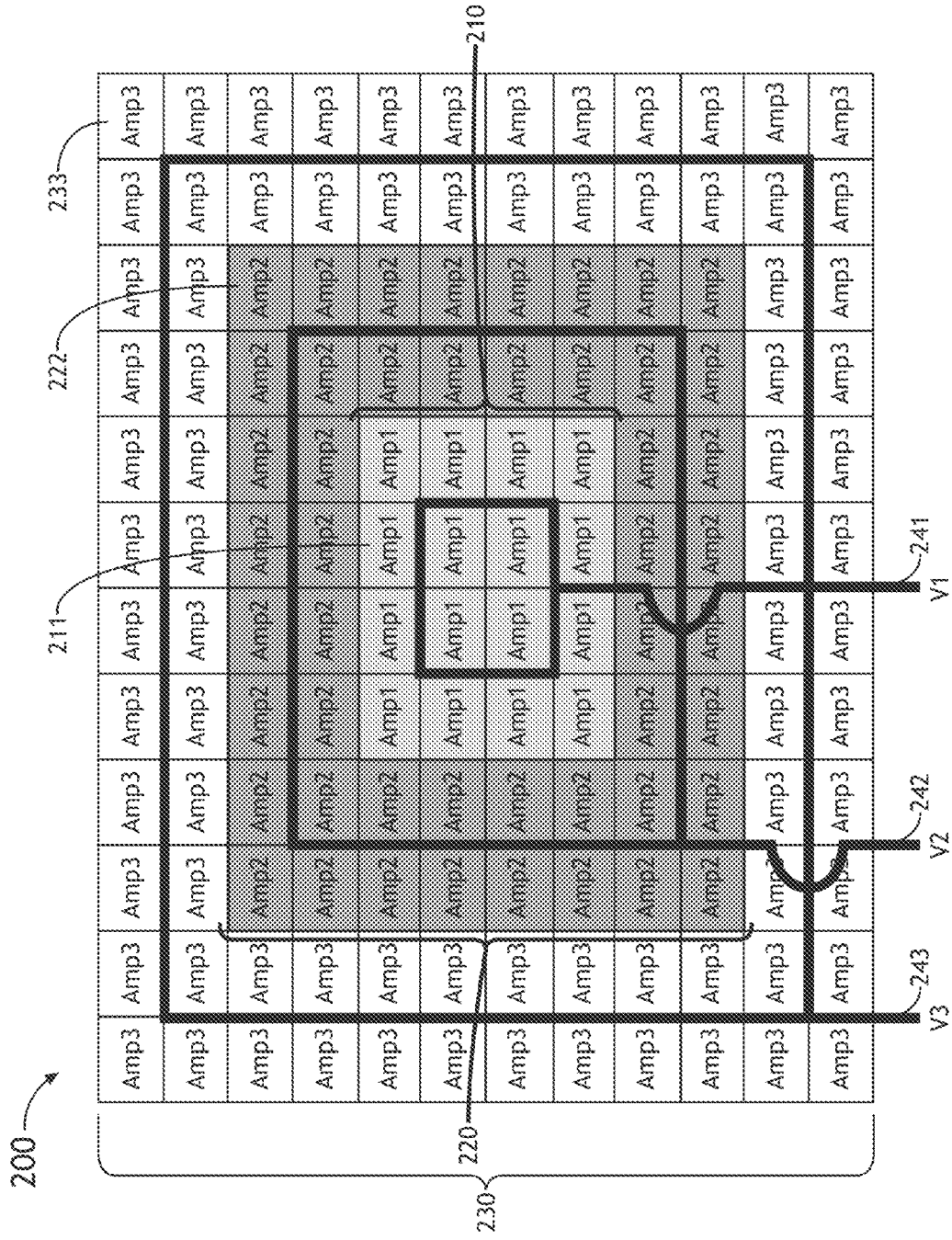
FIG. 2 shows an AESA including three groups of power amplifiers of one embodiment.
Figure 3:
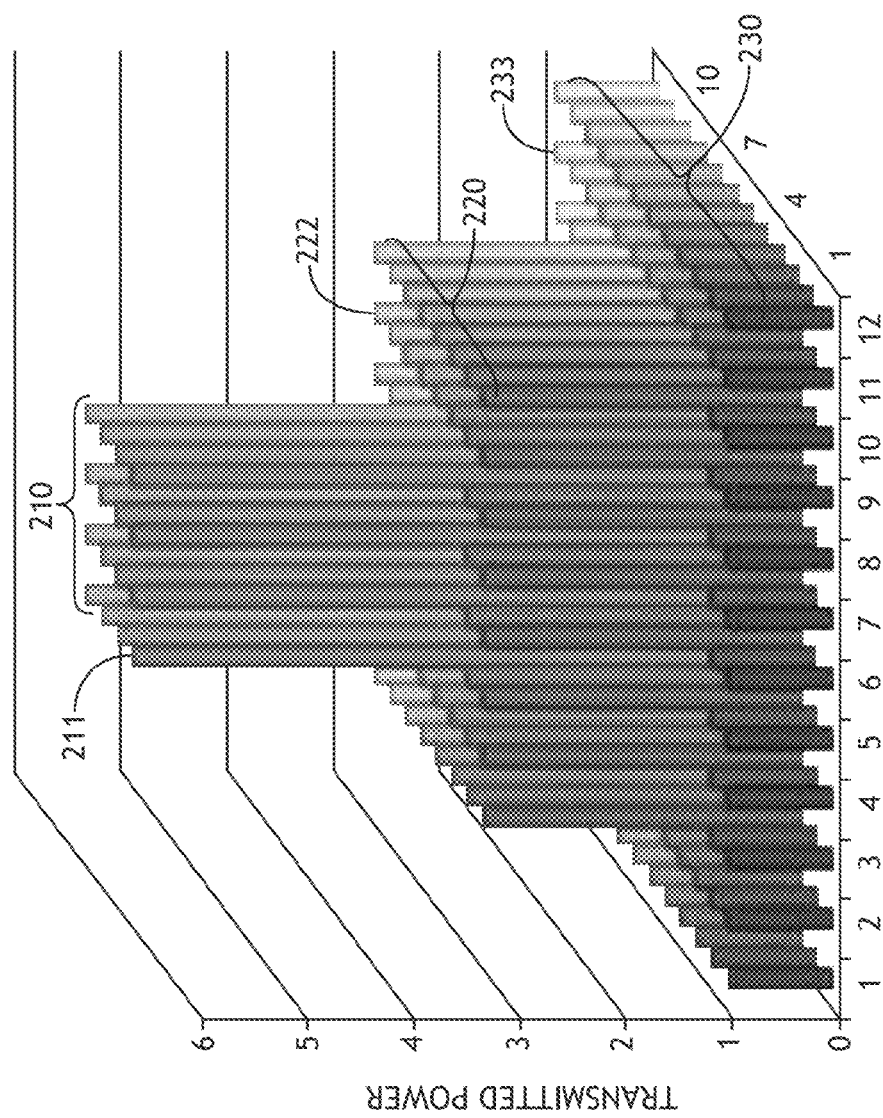
FIG. 3 depicts a graphical illustration of transmitted power tapering across the AESA achieved by drain bias voltage tapering according to one embodiment.

Referring now to FIGS. 2-3, an AESA 200 including three groups 210, 220, 230 of power amplifiers 211, 222, 233 of one embodiment is shown. As shown in FIG. 3, the AESA 200 includes a first group 210 of power amplifiers 211, a first drain voltage bias circuit line 241, a second group 220 of power amplifiers 222, a second drain voltage bias circuit line 242, a third group 230 of power amplifiers 233, and a third drain voltage bias circuit line 243, as well as other components or elements (not shown in FIG. 2) typically found in an AESA. The power amplifiers 211 of the first group 210 are coupled to the first drain voltage bias circuit line 241 such that the power amplifiers 211 are biased by a first drain voltage; the power amplifiers 222 of the second group 220 are coupled to the second drain voltage bias circuit line 242 such that the power amplifiers 222 are biased by a second drain voltage; and the power amplifiers 233 of the third group 230 are coupled to the third drain voltage bias circuit line 243 such that the power amplifiers 233 are biased by a third drain voltage. In some embodiments, the first drain voltage, the second drain voltage, and the third drain voltage are all different (e.g., higher or lower than one another; such as, the first drain voltage level is higher than the second drain voltage, which is higher than the third drain voltage). In other embodiments, one or more of the bias drain voltages are different. In some embodiments, the groups 210, 220, 230 of power amplifiers 211, 222, 233 are implemented within corresponding groups of transmit/receive modules. Applying a higher drain bias voltage to a power amplifier causes a higher transmit power. In some embodiments, each of the different drain bias voltages may be adjusted (e.g., dynamically adjusted) by associated T/R RFICs of transmit/receive modules across an AESA; in other embodiments, one, some, or all of the different drain bias voltages are fixed (e.g., predetermined and fixed) or are have a fixed range of predetermined voltages.

Embodiments implemented for tapering drain bias voltage of power amplifiers (e.g., power amplifiers of transmit/receive modules) achieve transmitted power tapering (e.g., as shown in FIG. 3) across the AESA 200 while allowing for the use of the same (e.g., identical) power amplifiers (e.g., power amplifiers of transmit/receive modules) across the AESA 200. Likewise, in embodiments where power amplifiers are implemented within transmit/receive modules, tapering drain bias voltage of transmit/receive modules, which include power amplifiers, achieves transmitted power tapering across the AESA while allowing for the use of the same (e.g., identical) transmit/receive modules across the AESA. Embodiments including an AESA implemented with drain bias tapering provide high efficiency (e.g., high power added efficiency) as compared to currently implemented AESAs (e.g., currently implemented AESAs, which rely on tapering the power inputs to different power amplifiers). Additionally, embodiments including an AESA implemented with drain bias tapering reduce costs as compared to currently implemented AESAs (e.g., currently implemented AESAs, which rely on the use of different transmit/receive modules having different power amplifiers implemented across the currently implemented AESA) because embodiments reduce the number of unique parts that have to be designed, manufactured, and installed.

Embodiments may utilize drain bias voltage tapering in any suitable AESA architecture, such as an AESA architecture which includes one or more components comprising one or some combination of RF field-effect transistors (FET), metal-semiconductor field effect transistors (MESFETs), GaAs RFICs, GaN RFICs, high-electron-mobility transistors (HEMTs), pseudomorphic HEMTs (pHEMT), silicon (Si) junction gate field-effect transistors (JFETs), Indium phosphide (InP) RFICs, or the like. Additionally, while in one embodiment an AESA may be configured to utilize a suitable drain bias voltage tapering scheme where an architecture of the AESA includes a plurality of T/R modules implemented on a printed circuit board (PCB), in other embodiments, the AESA may be configured to utilize a suitable drain bias voltage tapering scheme for any of other suitable AESA architectures, such as where a plurality of T/R modules are implemented on a single wafer or integrated circuit chip. For example, an AESA may be configured to utilize a suitable drain bias voltage tapering scheme and include a plurality of T/R modules implemented on a single wafer or integrated circuit chip, which may include at least one processing core coupled to a plurality of T/R modules implemented in the wafer or integrated circuit chip (e.g., as an T/R RF system on a chip (SoC)). That, is the wafer or integrated circuit chip itself may be a substrate having multiple T/R modules integrated in the substrate rather than mounting the T/R modules on a printed circuit board. For example, an AESA may include a wafer substrate having multiple T/R modules integrated in the wafer substrate, and the AESA may be configured for any of various suitable wavelength technologies, such as millimeter-wave technology (e.g., suitable for millimeter-wave radar). Additionally, in some embodiments, an AESA includes a plurality of wafers or integrated circuit chips mounted on a printed circuit board, wherein each wafer or integrated circuit chip is coupled to a common processor and wherein each wafer or integrated circuit chip includes a plurality of T/R receive modules integrated on the particular wafer or integrated circuit chip.

In one embodiment, each of the power amplifiers 211, 222, 233 are identical except for the drain voltage bias applied to the particular group of power amplifiers. Where the power amplifiers are identical, the power amplifiers are designed for and/or configured for receiving power inputs less than or equal to an identical peak input power level. In other embodiments, the power amplifiers 211 of the first group 210 are designed for and/or configured for receiving a first power input less than or equal to a first peak power level, the power amplifiers 222 of the second group 220 are designed for and/or configured for receiving a second power input less than or equal to a second peak power level, and the power amplifiers 233 of the third group 230 are designed for and/or configured for receiving a third power input less than or equal to a third peak power level, wherein the first peak power level, the second peak power level, and the third peak power level are all different (e.g., higher or lower than one another; such as, the first peak power level is greater than the second peak power level, which is greater than the third peak power level).

While one embodiment is depicted in FIG. 2 as including three groups 210, 220, 230 of power amplifiers 211, 222, 233, in other embodiments an AESA may be implemented as having any suitable number (e.g., two, three, four, . . . ten, . . . 20, . . . 100, or more) of groups of power amplifiers, where each group is biased by a particular drain voltage, some or all of which may be different. Further, while FIG. 2 depicts the first group 210 as including 16 power amplifiers 211, the second group 220 as including 48 power amplifiers 222, and the third group 230 as including 80 power amplifiers 233, in some embodiments, each group of power amplifiers may include any suitable number (e.g., one, two, three, four, . . . 100, . . . 1000, . . . 10,000, or more) of power amplifiers. Nevertheless, there is a tradeoff between (a) increasing AESA performance associated with implementing an AESA with a higher number of power amplifier field effect transistor (FET) drain voltage bias circuit lines (e.g., 241, 242, 243) distributed through an ESA panel to realize the drain voltages across the AESA panel and (b) the complexity added to a printed circuit board by including the drain voltage bias circuit lines in the printed circuit board of the AESA. That is, increasing the number of drain voltage bias circuit lines (e.g., 241, 242, 243) within an AESA with hundreds, thousands, or more of power amplifier modules quickly increases the complexity of the AESA's printed circuit board. The increased complexity for a higher number of drain voltage bias circuit lines drives up production costs and decreases printed circuit board manufacturing yield and reliability. In some embodiments, three or four drain voltage bias circuit lines provides a suitable tradeoff between the printed circuit board complexity and tapering requirement; however, other embodiments may be implemented with any number of drain voltage bias circuit lines to meet suitable design requirements. Further, in some embodiments, additional transmitted power output tapering may be achieved by utilizing drain bias voltage tapering and by utilizing radio frequency input power tapering across each group of power amplifiers biased by a particular drain voltage.

While the embodiment depicted in FIG. 2 includes the third group 230 of power amplifiers 233 arranged in a ring (e.g., a rectangular ring) around the second group 220 of power amplifiers 222, which in turn is arranged in a ring around the first group 210 (e.g., a central group) of power amplifiers 210, in other embodiments an AESA may be implemented as having a plurality of groups of power amplifiers arranged in any suitable arrangement. In some embodiments, the plurality of power amplifiers are arranged in a non-ring arrangement, such as in rows of power amplifiers, columns of power amplifiers, tiled regions of power amplifiers, v-shaped regions of power amplifiers, or the like. In some embodiments, a group of power amplifiers includes only power amplifiers, which are adjacently located; in other embodiments, a group of power amplifiers may include one or more power amplifiers which are non-adjacently or non-contiguously located (e.g., where a non-group power amplifier is located between two power amplifiers of the same group) with respect to one or more other power amplifiers of the group.

Referring now to FIG. 3, a graphical illustration of transmitted power tapering across the AESA 200 achieved by drain bias voltage tapering according to one embodiment is shown. FIG. 3 shows the transmitted power tapering effect associated with each of the corresponding power amplifier elements (e.g., power amplifiers 211 of the first group 210, power amplifiers 222 of the second group 220, and power amplifiers 233 of the third group 230) across the AESA 200.

As shown in FIG. 3 the transmitted power tapering of the power amplifiers 211, 222, 233 across the AESA 200 is achieved by utilizing drain bias tapering of the power amplifiers 211, 222, 233, wherein the power amplifiers 211, 222, 233 are identical. While the transmitted power tapering effect of drain bias voltage tapering is shown in FIG. 3 with respect to one embodiment, it is appreciated that in other embodiments any desired transmitted tapering effect may be achieved by utilizing any suitable drain bias voltage tapering scheme across any suitable AESA architecture having any suitable arrangement of power amplifiers or groups of power amplifiers.

Figure 4:
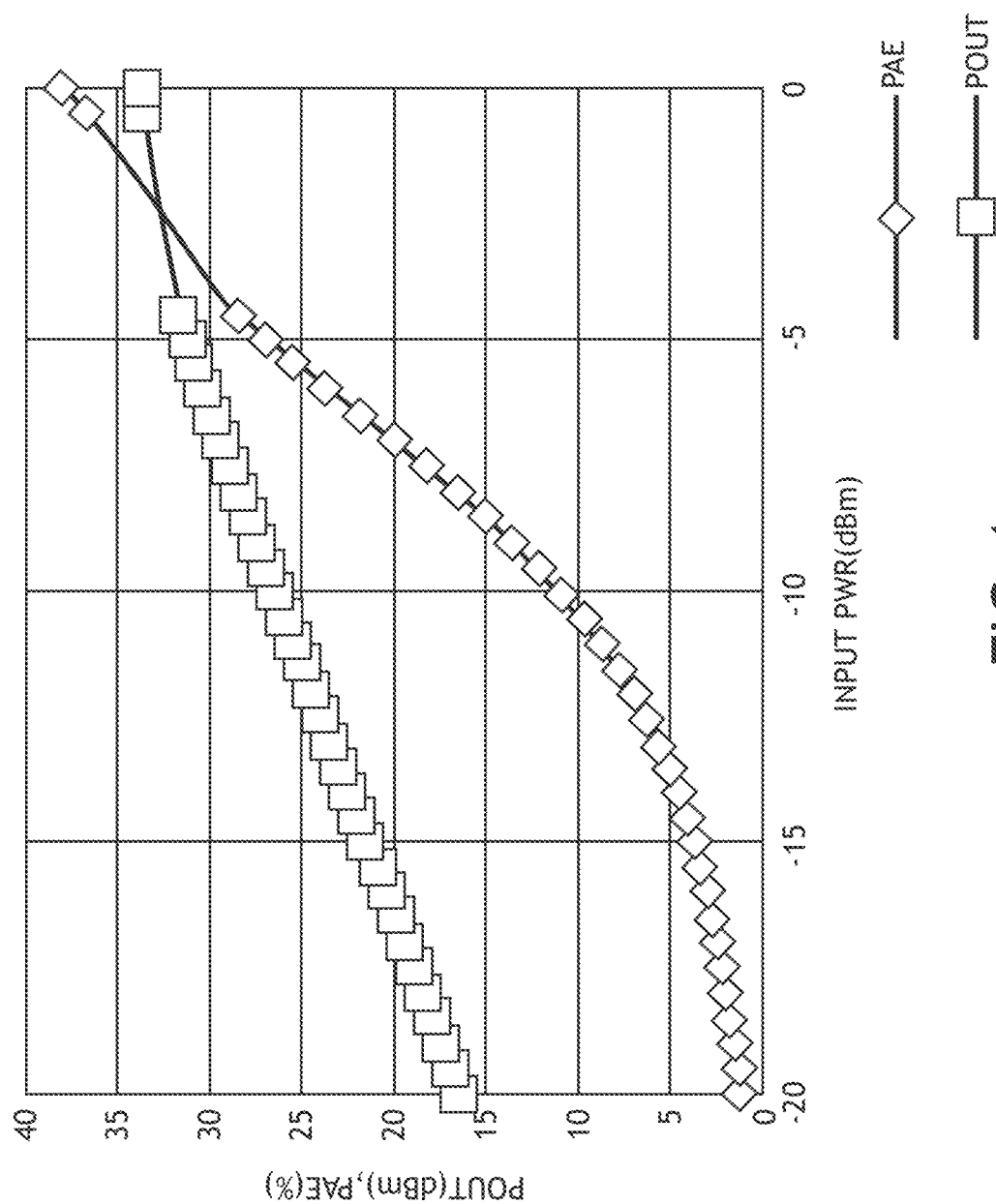
FIG. 4 depicts a graph of output power and power added efficiency of a power amplifier as a function of input power at a fixed drain bias voltage of one embodiment.

Referring now to FIG. 4, a graph shows output power and power added efficiency of a 2 Watt (W) power amplifier (implemented within a Gallium Arsenide (GaAs) T/R RFIC of a transmit/receive module) as a function of input power (e.g., radio frequency input power) at a fixed drain bias voltage of 7 volts (V) of one embodiment. As shown in FIG. 4, as the power output falls by 10 dBm from the shown maximum of about 34 dBm to about 24 dbm, the corresponding power added efficiency drops from about 37% to about 7%. As demonstrated in FIG. 4, an AESA including power amplifiers all having the same fixed drain bias voltage suffers greatly from reduced power added efficiency if power output tapering is achieved solely by reducing the input power to power amplifiers located further from the center of the AESA.

Figure 5:
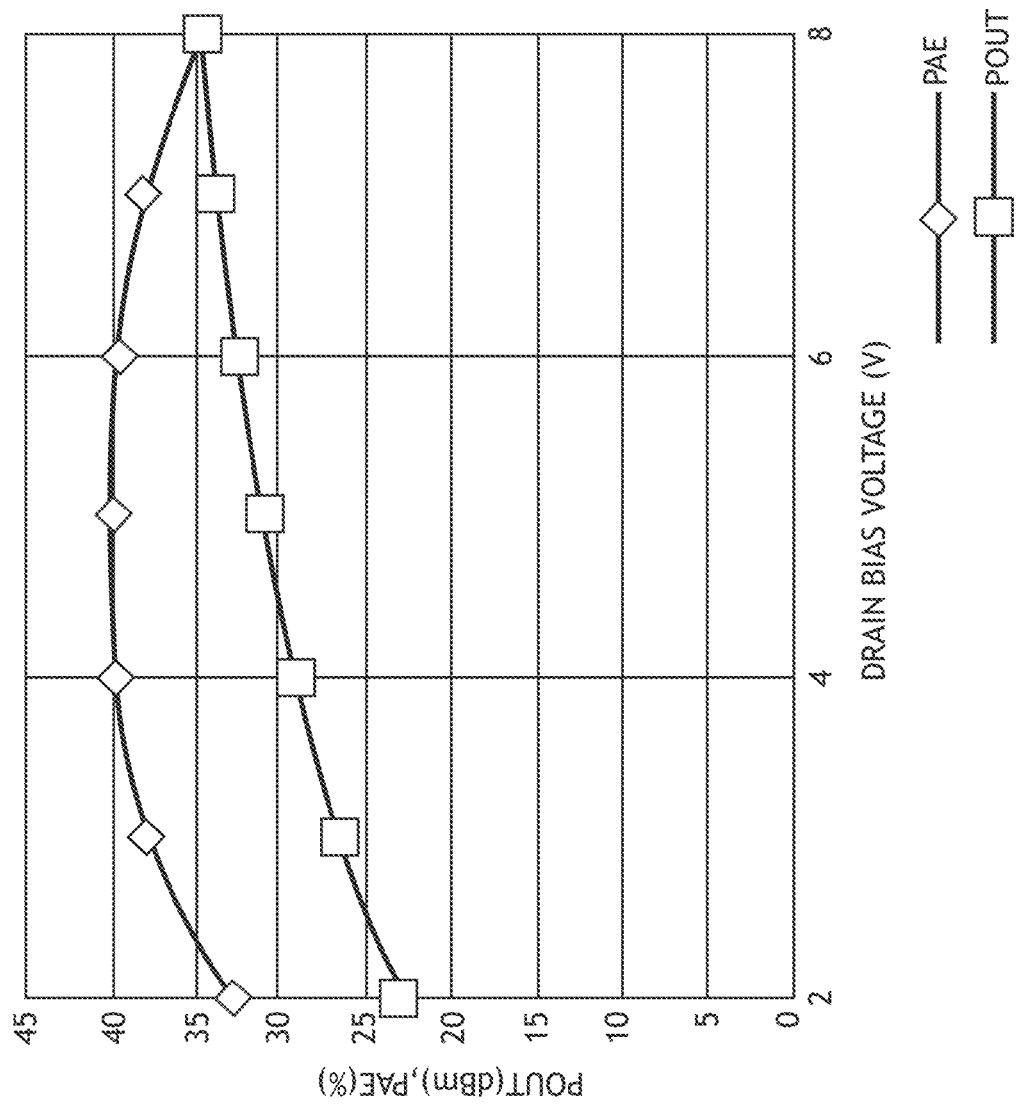
FIG. 5 depicts a graph of output power and power added efficiency of a power amplifier as a function of drain bias voltage at a fixed radio frequency input power of one embodiment.

Referring now to FIG. 5, a graph shows output power and power added efficiency of a 2 Watt (W) power amplifier (implemented within a Gallium Arsenide (GaAs) T/R RFIC of a transmit/receive module) as a function of drain bias voltage at a fixed radio frequency input power of one embodiment. As shown in FIG. 5, as the power output falls by 10 dBm from the shown maximum of about 34 dBm to about 24 dbm, the corresponding power added efficiency only drops from about 35% to about 33%. As demonstrated in FIG. 5, an AESA including power amplifiers all having the same fixed power input levels maintains a high power added efficiency (e.g., between about 33% and 40%) if power output tapering is achieved by reducing the drain bias voltage applied to power amplifiers located further from the center of the AESA. That is, in an embodiment utilizing a fixed power input level to each power amplifier of an AESA with suitable input/output (I/O) port impedance match, a 13 dB power output taper is achieved while maintain about 33% to 40% power added efficiency. While the effect of drain bias voltage tapering is shown in FIG. 5 with respect to a particular component of one embodiment, it is appreciated that in other embodiments any desired transmitted tapering effect may be achieved by utilizing any suitable drain bias voltage tapering scheme across any suitable AESA architecture having any suitable arrangement of power amplifiers or groups of power amplifiers.

Figure 6:
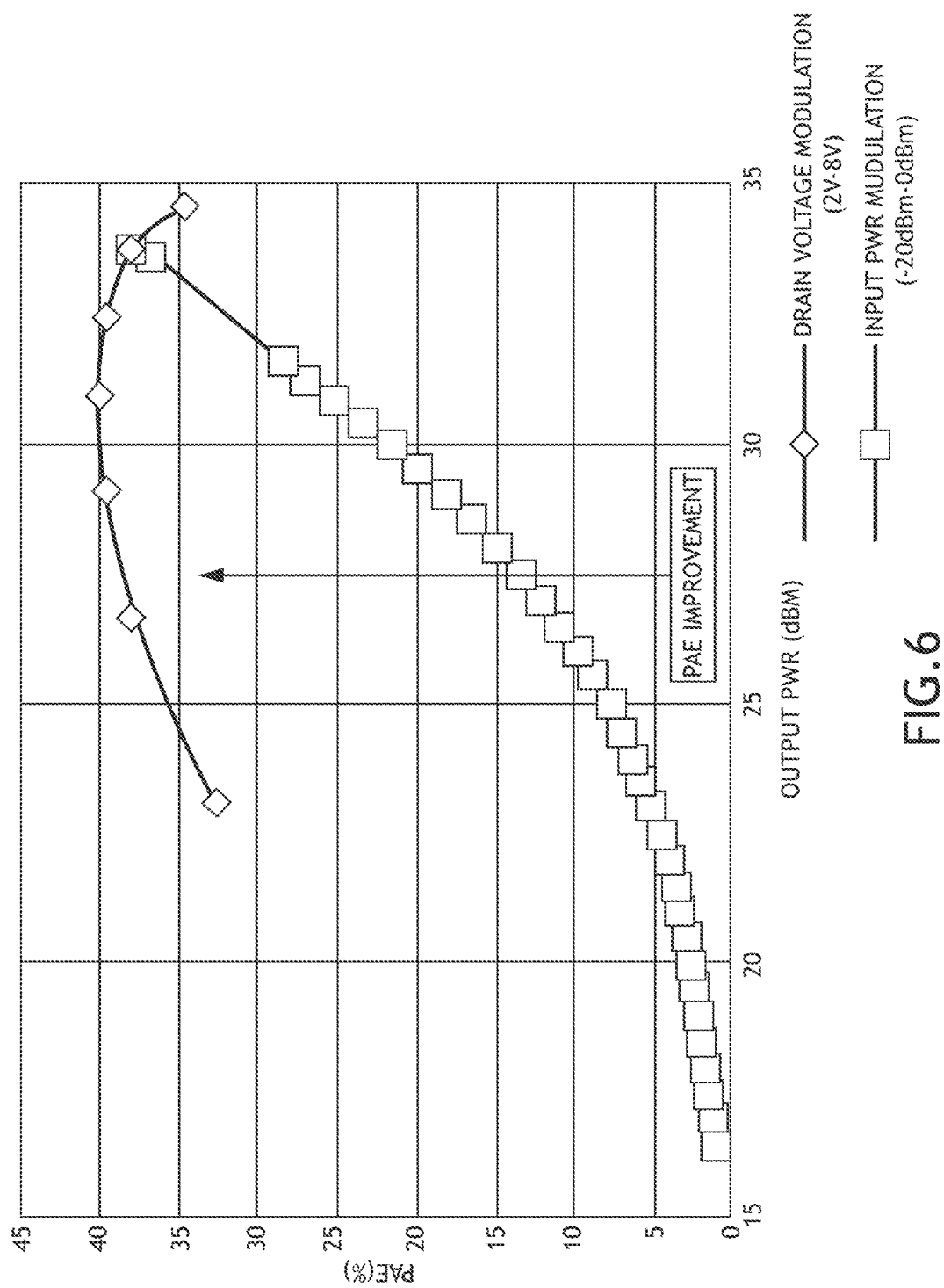
FIG. 6 depicts a graph of power added efficiency of a power amplifier as a function of transmitted output power for drain voltage modulation and input power modulation.

Referring now to FIG. 6, a graph shows power added efficiency of a 2 Watt (W) power amplifier (implemented within a Gallium Arsenide (GaAs) T/R RFIC of a transmit/receive module) as a function of transmitted output power for drain voltage modulation and input power modulation. As illustrated by FIG. 6, embodiments utilizing drain bias voltage tapering significantly improve the power added efficiency of an AESA without adding recurring and non-recurring costs to the AESA manufacturing because a single power amplifier design (e.g., power amplifiers designed for single common peak power level) can be utilized throughout the AESA. While the effect of drain bias voltage tapering is shown in FIG. 6 with respect to a particular component of one embodiment, it is appreciated that in other embodiments any desired transmitted tapering effect may be achieved by utilizing any suitable drain bias voltage tapering scheme across any suitable AESA architecture having any suitable arrangement of power amplifiers or groups of power amplifiers.

Embodiments implemented with power amplifiers utilizing drain bias voltage tapering allow a common (e.g., identical) power amplifier structure to be utilized throughout the entire AESA while at the same time improving (e.g., optimizing) power added efficiency for each individual power amplifier within the AESA.

Figure 7:
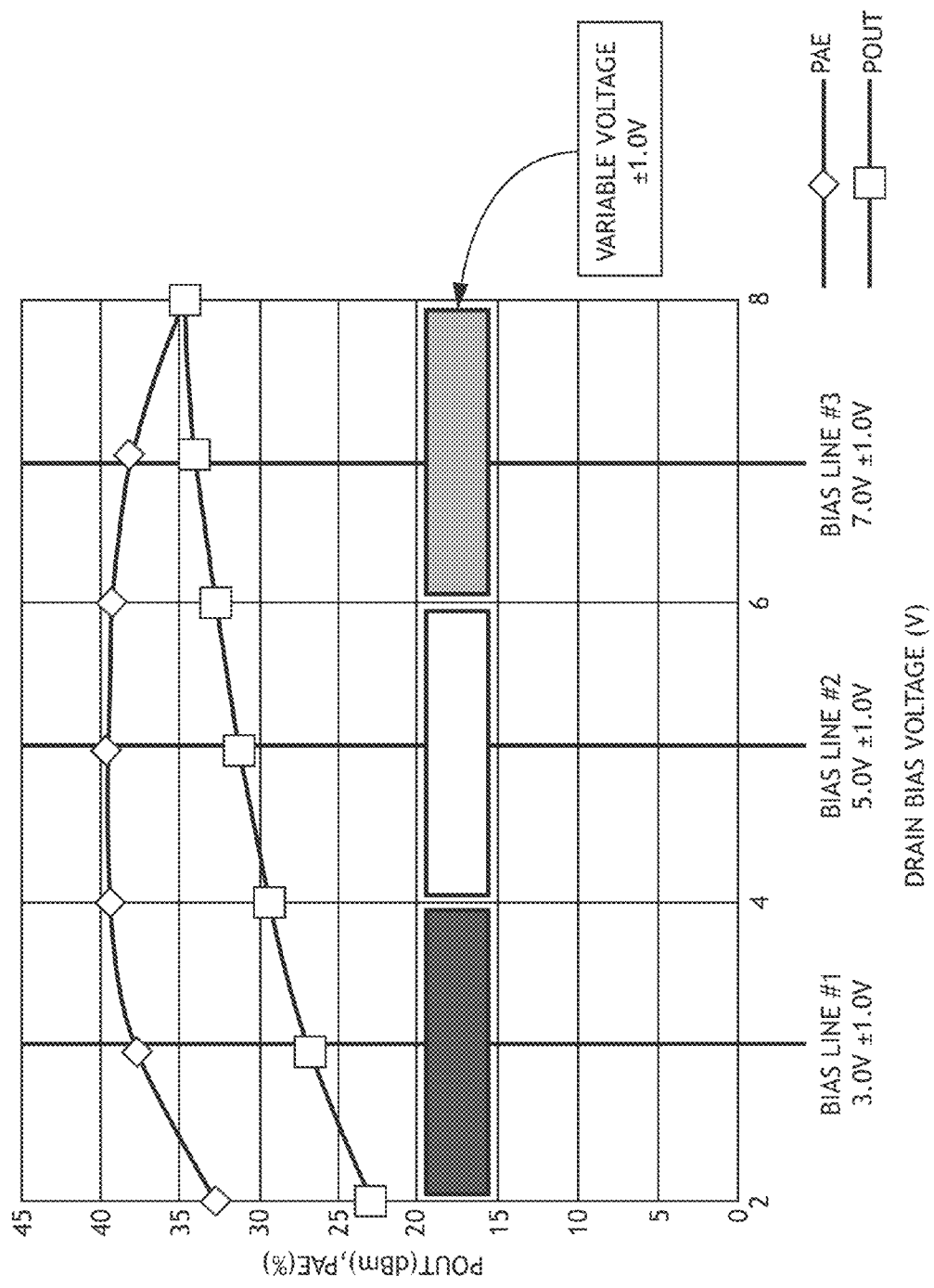
FIG. 7 depicts a graph of output power and power added efficiency of a power amplifier as a function of drain bias voltage at a fixed radio frequency input power of one embodiment.

Referring now to FIG. 7, a graph shows output power and power added efficiency of a 2 Watt (W) power amplifier (implemented within a Gallium Arsenide (GaAs) T/R RFIC of a transmit/receive module) as a function of drain bias voltage at a fixed radio frequency input power of one embodiment. FIG. 7 illustrates the output power and power added efficiency for power amplifiers connected to three different drain bias circuit lines, wherein each of the three different drain bias circuit lines has a different variable drain bias voltage applied to the particular drain bias circuit line. As shown in FIG. 7, a first power amplifier biased by a variable drain voltage of 3.0 V+/−1.0 V has an output power of between 23 dB and 29 dB and a power added efficiency of between 33% and 39%; a second power amplifier biased by a variable drain voltage of 5.0 V+/−1.0 V has an output power of between 29 dB and 33 dB and a power added efficiency of between 38% and 39%; and a third power amplifier biased by a variable drain voltage of 7.0 V+/−1.0 V has an output power of between 33 dB and 35 dB and a power added efficiency of between 34% and 39%. While one embodiment includes drain bias voltage tapering with three different variable drain bias voltages of 3.0 V+/−1.0 V, of 5.0 V+/−1.0 V, and of 7.0 V+/−1.0 V, other embodiments may be implemented with any suitable number of variable drain bias voltages, any suitable range (e.g., +/−0.01 V, +/−0.1 V, +/−0.5 V, +/−2.0 V, +/−5.0 V, +/−10.0 V, or the like) of variable voltage for each variable drain bias voltage, and/or any suitable average drain bias voltage (e.g., 0.5 V, 1.0 V, 4.0 V, 8.0 V, 20.0 V, 100.0 V, or the like). In one embodiment, the range of variable voltage for each for each variable drain bias voltage is the same; in other embodiments, one or more of the variable drain bias voltages has a range of variable voltage different from another variable drain bias voltage. While the effect of drain bias voltage tapering is shown in FIG. 7 with respect to a particular component of one embodiment, it is appreciated that in other embodiments any desired transmitted tapering effect may be achieved by utilizing any suitable drain bias voltage tapering scheme across any suitable AESA architecture having any suitable arrangement of power amplifiers or groups of power amplifiers.

Figure 9:
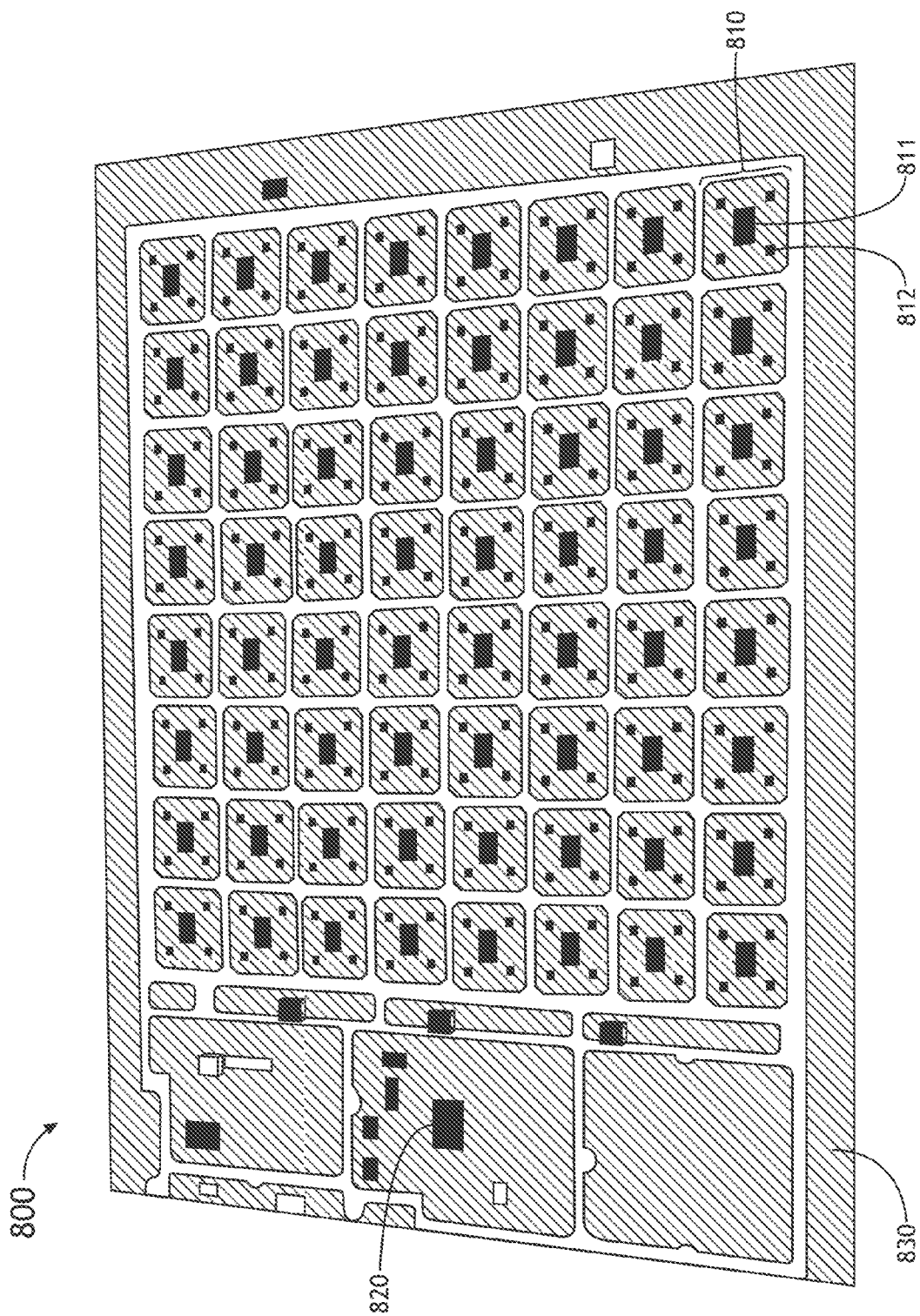
FIG. 9 depicts a backside view of the AESA of one embodiment.
Figure 10:
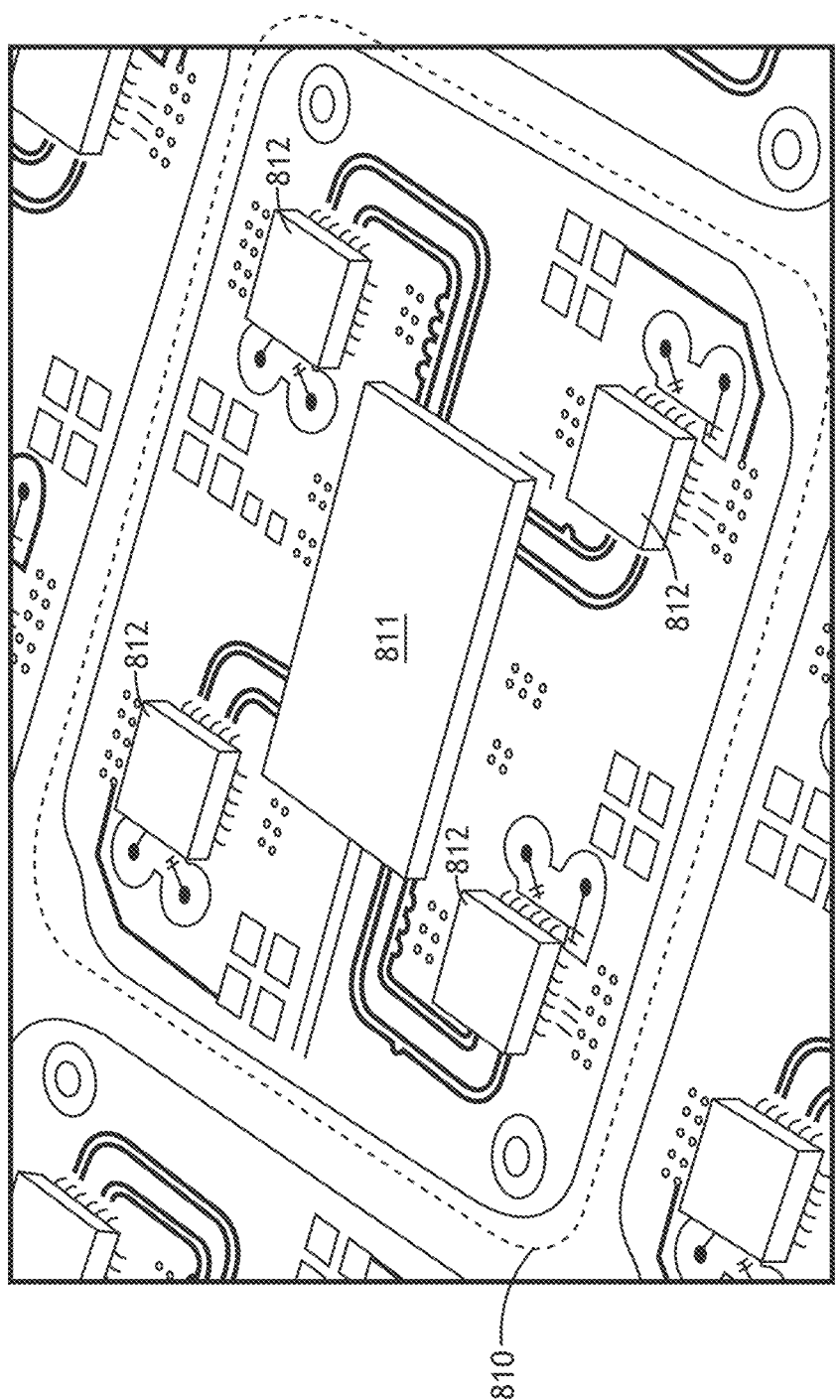
FIG. 10 depicts a close-up view of a transmit/receive module on the backside of the AESA of one embodiment.
Figure 11:
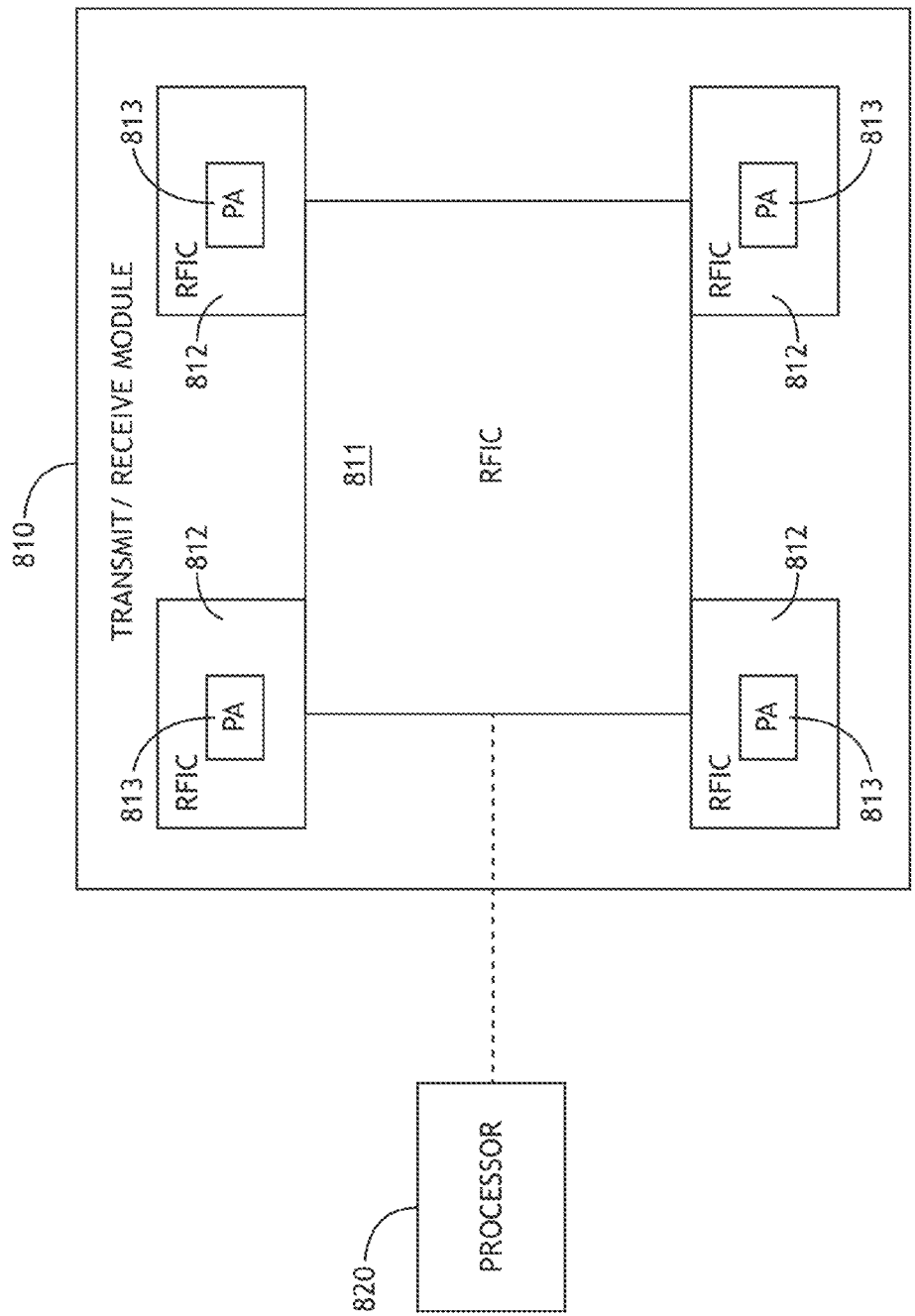
FIG. 11 depicts a box diagram of the transmit/receive module of the AESA coupled to a processor of one embodiment.

FIG. 7 illustrates that an embodiment allows power amplifier quantization to be reduced (e.g., minimized) by utilizing groups of power amplifiers (or transmit/receive modules implemented with one or more power amplifiers) biased with different variable drain bias voltages. In some embodiments, the variable drain bias voltages are provided by whatever power amplifier power supply scheme is implemented within the AESA. Some embodiments allow power amplifier power quantization to be reduced (e.g., minimized) by utilizing groups of power amplifiers (or transmit/receive modules implemented with one or more power amplifiers), which are biased with different variable drain bias voltages and which receive different power input levels. For example, each power amplifier of a particular group of power amplifiers may be biased by a particular variable drain voltage (e.g., above or below the average or nominal drain voltage) on each drain bias voltage circuit line, and each power amplifier of the particular group of power amplifiers may be driven by a particular variable input power level for each of the drain bias voltage circuit lines. In some embodiments, power amplifier RF pre-stage driver chains (e.g., T/R RFIC 811, as shown in FIGS. 9-11) are configured to provide variable input power to each of the power amplifiers (e.g., 813) within in an AESA (e.g., AESA 800). In some embodiments, an AESA is implemented with as many different drain bias circuit lines as is suitable, feasible, or practical considering system, cost, and reliability constraints.

Figure 8:
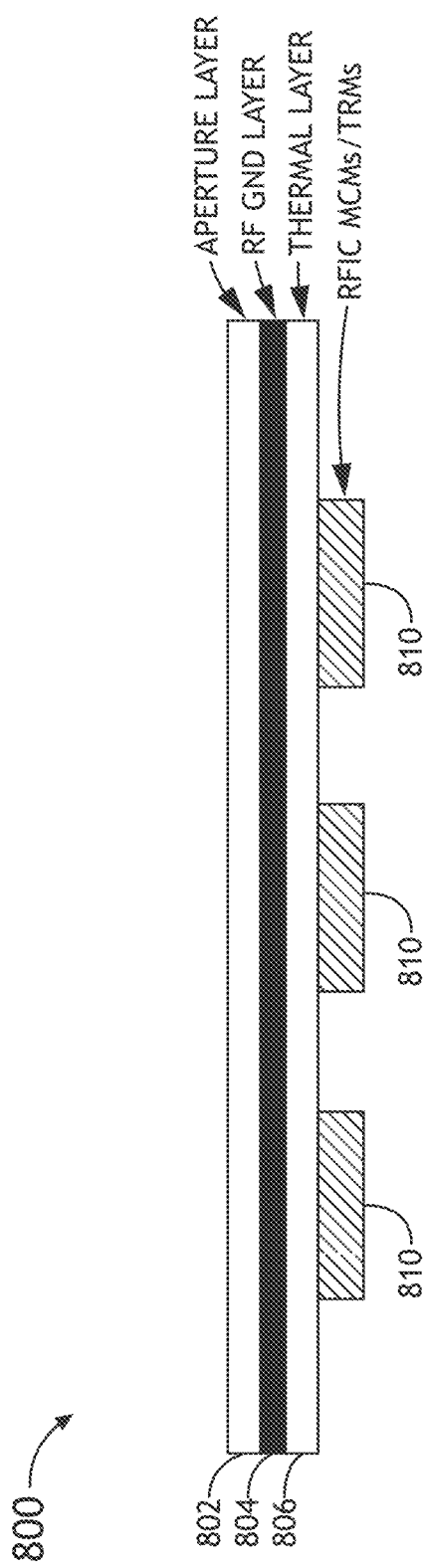
FIG. 8 depicts a partial cross-sectional view of an AESA of one embodiment.

Referring now to FIG. 8, a partial cross-sectional view of an AESA 800 of one embodiment is shown. The AESA 800 includes an aperture layer 802, an RF ground layer 804, a thermal layer 806, and a plurality of transmit/receive modules 810, as well as other components typical of AESAs. In some embodiments, the aperture layer includes a plurality (e.g., hundreds, thousands, or more) of radiating elements 102. The RF ground layer 804 is positioned between the aperture layer 802 and the thermal layer 806. The transmit/receive modules 810 are implemented in or on (e.g., mounted to a printed circuit board 830, as shown in FIG. 9) a backside of the AESA 800. In some embodiments, the transmit/receive modules 810 are radio frequency integrated circuit (RFIC) multi-chip modules (e.g., as show in FIGS. 9-11). In other embodiments, each transmit/receive module 810 includes a plurality of T/R RFIC sub-systems integrated on a single integrated circuit chip or is implemented as or on a single integrated circuit chip.

Referring now to FIG. 9, a backside view of the AESA 800 is shown. The AESA 800 includes a printed circuit board 830. One or more processors (e.g., processor 820) and a plurality of transmit receive modules 810 are connected to (e.g., implemented in or on, mounted to, or the like) the printed circuit board 830. The processor 820 (e.g., a field programmable gate array, or other processing unit) is configured to instruct the transmit/receive modules 810 to perform various operations (e.g., provide a particular input power to one or more power amplifiers (e.g., 813), adjust an input power to one or more power amplifiers (e.g., 813), apply a particular drain bias voltage to one or more power amplifiers (e.g., 813), adjust a particular drain bias voltage applied to one or more power amplifiers, or the like). In other embodiments, the processor 820 is implemented in a computing device which is coupled to the AESA 800, but not physically contained within the AESA 800. The processor 820 is configured to receive outputs, information, or data from the transmit/receive modules 810. Each transmit receive modules 810 includes one or more transmit/receive (T/R) radio frequency integrated circuits (RFICs) 811811 and one or more supporting T/R RFICs 812. In some embodiments, the transmit/receive modules 810 are implemented as a plurality of groups of transmit/receive modules 810, wherein each group of transmit/receive modules 810 includes one or more power amplifiers (e.g., 813, which may be implemented in the one or more supporting T/R RFICs 812) biased by a drain voltage (similar to the power amplifier groups 210, 220, 230 shown in and described with respect to FIG. 2) different from the drain bias voltages applied to power amplifiers of another group of transmit/receive modules 810. For example, each transmit/receive module 810 may be considered a unit cell. In one embodiment, the unit cell includes one 4-channel T/R RFIC 811 and four supporting RFICs 812. In some embodiments, the transmit/receive modules 810 are implemented as a plurality of groups of transmit/receive modules 810, wherein each group of transmit/receive modules 810 includes one or more power amplifiers (e.g., 813, which may be implemented in the one or more supporting T/R RFICs 812) which receive an input power level different from the input power level received by power amplifiers of another group of transmit/receive modules 810. In one embodiment, the AESA 800 is implemented as an X Band AESA where the printed circuit board 830 is a multi-layer printed circuit board; however, in other embodiments, the AESA 800 may be implemented to receive and/or transmit over any suitable or designed for radio frequency band or combination of radio frequency bands (e.g., Ka, Ku, L, C, S, and/or the like). While one embodiment is shown with a particular AESA architecture, other embodiments may include or be implemented with any other suitable AESA architecture; that is, for example, drain bias voltage tapering may be applied to any suitable AESA architecture.

Referring now to FIGS. 10-11, views of a transmit/receive module 810 of some embodiments are shown. FIG. 10 shows a close-up view of a transmit/receive module 810 on the backside of the AESA 800 of one embodiment. As shown in FIG. 10, transmit/receive module 810 is implemented within an AESA unit cell as packaged SiGE and GaAs RFICs. FIG. 11 shows a box diagram of the transmit/receive module 810 of the AESA 800 coupled to a processor 820 of one embodiment. As shown in FIGS. 10-11, the transmit/receive modules 810 are implemented as transmit/receive multi-chip modules including a plurality of coupled integrated circuit chips (e.g., T/R RFIC 811 and supporting T/R RFICs 812).

Referring still to FIGS. 10-11, the transmit/receive module 810 includes at least one (e.g., one, two, or more) transmit/receive (T/R) radio frequency integrated circuit (RFIC) 811 and at least one (e.g., one, two, three, four (as shown), . . . eight, or more) power amplifier 813 implemented in at least one supporting T/R RFIC 812. In one embodiment, each T/R RFIC 811 is a SiGe T/R RFIC, and each a supporting T/R RFIC 812 is a GaAs T/R RFIC. Each T/R RFIC 811 works in concert with at least one supporting T/R RFIC 812. The at least one power amplifier 813 of each supporting T/R RFIC 812 is configured to increase (e.g., amplify) RF transmit power levels higher than would be possible with the T/R RFIC 811, alone. Additionally, the receive side circuitry of each supporting T/R RFIC 812 reduces a noise figure to levels lower than the capability of the T/R RFIC 811, alone. For example, the T/R RFIC 811 may be a main T/R RFIC of the T/R module 810, and each supporting T/R RFIC 812 may be a secondary T/R RFIC configured to enhance performance of the main T/R RFIC.

As shown in FIG. 11, each of the at least one power amplifier 813 is implemented in a supporting T/R RFIC 812 which is coupled to the at least one T/R RFIC 811. Each of the power amplifiers 813 of a supporting T/R RFIC 812 is coupled to and/or configured to provide power to an associated radiating element 102 of the AESA 800 such that the associated radiating element 102 outputs a signal having a particular transmitted power (as well as other RF signal characteristics, such as phase, polarization, frequency, or the like).

In one embodiment, the at least one T/R RFIC 811 of the transmit/receive module 810 is a four-channel silicon germanium (SiGe) T/R RFIC, and the at least one supporting T/R RFIC 812 of the transmit/receive module 810 is four gallium arsenide (GaAs) RFICs. Each of the four GaAs RFICs includes a power amplifier 813. The four-channel SiGe T/R RFIC receives instructions from the processor 820 of the AESA 800 with instructions of how to adjust the input power and drain bias voltage for the four GaAs T/R RFICs. Based on the instructions received from the processor 820, the four-channel SiGe T/R RFIC provides input power to each of the four GaAs T/R RFICs and applies a drain bias voltage to each of the four GaAs T/R RFICs. For example, the four-channel SiGe T/R RFIC provides drain bias voltage and/or current outputs to each of the four GaAs T/R RFICs (which include the power amplifiers 813). The four GaAs T/R RFICs (which include the power amplifiers 813) may be required to achieve higher power amplifier output power and lower noise figures than the four-channel SiGe T/R RFIC can provide. In one embodiment, the four-channel SiGe T/R RFIC provides a variable input drive power to the four GaAs T/R RFICs by utilizing one or more variable gain amplifiers (VGAs). In one embodiment, the four-channel SiGe T/R RFIC provides both drain bias voltages and variable power inputs to the power amplifiers 813. In one embodiment, the transmit/receive module 810 is implemented within a weather radar system AESA.

In one embodiment, the four-channel SiGe T/R RFIC has a surface area footprint of approximately 10 mm$^2$ (e.g., +/4 mm$^2$). In one embodiment, the four-channel SiGe T/R RFIC includes eight VGAs, eight phase shifters, four RF detectors, 32 digital-to-analog converters (DACs), four analog-to-digital converters (ADCs), 2 RF combiners (e.g., reversed power dividers (e.g., 114)), redundant serial peripheral interface (SPI) buses, RF power sensors, and temperature sensors. In one embodiment, the temperature and power sensors of the four-channel SiGe T/R RFIC allow for calibration, built-in self-test (BIST), and self-healing. In one embodiment, the four-channel SiGe T/R RFIC is configured for cyclic redundancy check (CRC) monitoring to provide real-time diagnostics and/or graceful degradation. In one embodiment, the phase shifters of the four-channel SiGe T/R RFIC are 10-bit phase shifters, and the VGAs of the four-channel SiGe T/R RFIC are 30 dB VGAs. In one embodiment, the phase shifters and the VGAs of the four-channel SiGe T/R RFIC provide for low side lobe levels, dynamic pattern synthesis, and self-calibration. While one embodiment includes the at least one T/R RFIC 811 implemented as the four-channel SiGe T/R RFIC including particular elements, a particular number of the particular elements, and particular dimensions, in other embodiments, the at least one T/R RFIC 811 may include any suitable elements, any suitable number of the suitable elements, and any suitable dimensions.

While in one embodiment the at least one T/R RFIC 811 is implemented as a four-channel SiGe T/R RFIC, in other embodiments the at least one T/R RFIC 811 is implemented for any number of suitable channels (e.g., one, two, three, four, five, six, seven, eight, nine, or more channels) and by utilizing any suitable semiconductor material (e.g., gallium nitride (GaN), GaAs, or the like). While in one embodiment each of the at least one supporting T/R RFIC 812 is implemented as a GaAs T/R RFIC, in other embodiments the at least one supporting T/R RFIC 812 is implemented by utilizing any suitable semiconductor material (e.g., GaN, SiGe, or the like).

In some embodiments, the transmit/receive modules 810 (e.g., radio frequency integrated circuit (RFIC) multi-chip modules), which include one or more power amplifiers 813, are implemented as plurality of groups of transmit/receive modules arranged across the AESA 800 with the power amplifiers 813 of each group of transmit/receive modules 810 being biased by a different drain voltage (as similarly shown in FIG. 2, which shows a plurality of groups 210, 220, 230 of power amplifiers 211, 222, 233, wherein the power amplifiers 211, 222, 233 of each group 210, 220, 230 are coupled to a different drain bias voltage circuit line 241, 242, 243).

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the disclosed subject matter. The accompanying claims may present elements of the various steps in a sample order, and are not necessarily meant to be limited to the specific order or hierarchy presented.

It is believed that embodiments of the inventive concepts disclosed herein and many of their attendant advantages will be understood by the foregoing description, and it will be apparent that various changes can be made in the form, construction, and arrangement of the components thereof without departing from the scope of the inventive concepts or without sacrificing all of their material advantages. The form herein before described being merely an explanatory embodiment thereof, it is the intention of the following claims to encompass and include such changes.

What is claimed is:

1. An active electronically scanned array, comprising:
a plurality of power amplifiers including:
at least two first power amplifiers biased by a first drain voltage via at least one first bias drain circuit line; and
at least two second power amplifiers biased by a second drain voltage different from the first drain voltage via at least one second bias drain circuit line;
the at least one first bias drain circuit line coupled with one or more of the at least two first power amplifiers;
at least one first transmit/receive (T/R) radio frequency integrated circuit (RFIC) coupled with the at least one first bias drain circuit line and configured to control the first drain voltage;
the at least one second bias drain circuit line coupled with one or more of the at least two second power amplifiers; and
at least one second T/R RFIC coupled with the at least one second bias drain circuit line and configured to control the second drain voltage.

2. The active electronically scanned array of claim 1, wherein the one or more of the at least two first power amplifiers are configured to receive a first peak power level from the at least one first T/R RFIC, wherein the one or more of the at least two second power amplifiers are configured to receive a second peak power level from the at least one second T/R RFIC, the first peak power level being different from the second peak power level.

3. The active electronically scanned array of claim 1, further comprising:
at least two first radiating elements, each of the at least two first radiating elements coupled with a particular first power amplifier of the at least two first power amplifiers and configured to receive power from the particular first power amplifier; and
at least two second radiating elements, each of the at least two second radiating elements coupled with a particular second power amplifier of the at least two second power amplifiers and configured to receive power from the particular second power amplifier.

4. The active electronically scanned array of claim 1, further comprising at least one third bias drain circuit line and at least one third T/R RFIC, the at least one third T/R RFIC coupled with the at least one third bias drain circuit line and configured to control a third drain voltage, wherein the plurality of power amplifiers includes at least two third power amplifiers biased by the third drain voltage different from the first drain voltage and the second drain voltage, the at least one third bias drain circuit line coupled with one or more of the at least two third power amplifiers.

5. The active electronically scanned array of claim 1, wherein the at least two second power amplifiers are arranged in a ring around the at least two first power amplifiers.

6. A method for operating an active electronically scanned array, comprising:
applying, by at least one first transmit/receive (T/R) radio frequency integrated circuit (RFIC), a first bias drain voltage to at least two first power amplifiers of the active electronically scanned array, the at least one first T/R RFIC coupled with at least one first bias drain circuit line and configured to control the first bias drain voltage, the at least one first bias drain circuit line coupled with one or more of the at least two first power amplifiers; and
applying, by at least one second T/R RFIC, a second bias drain voltage to at least two second power amplifiers of the active electronically scanned array, the first bias drain voltage being different from the second bias drain voltage, the at least one second T/R RFIC coupled with at least one second bias drain circuit line and configured to control the second bias drain voltage, the at least one second bias drain circuit line coupled with one or more of the at least two second power amplifiers.

7. The method of claim 6, further comprising:
applying, by at least one third T/R RFIC, a third bias drain voltage to at least two third power amplifiers of the active electronically scanned array, the third bias drain voltage being different from the first bias drain voltage and the second bias drain voltage, the at least one third T/R RFIC coupled with at least one third bias drain circuit line and configured to control the third bias drain voltage, the at least one third bias drain circuit line coupled with one or more of the at least two third power amplifiers.

8. The method of claim 6, further comprising:
providing, by the at least one first T/R RFIC, an input power less than or equal to an identical peak power level to one or more of the at least two first power amplifiers; and
providing, by the at least one second T/R RFIC, an input power less than or equal to the identical peak power level to one or more of the at least two second power amplifiers.

9. The method of claim 6, further comprising:
providing, by the at least one first T/R RFIC, an input power less than or equal to a first peak power level to one or more of the at least two first power amplifiers; and
providing, by the at least one second T/R RFIC, an input power less than or equal to a second peak power level to one or more of the at least two second power amplifiers, the first peak power level being different from the second peak power level.

10. The method of claim 6, further comprising:
providing, by the at least one first T/R RFIC, a first input power less than or equal to a first peak power level to at least one of the at least two first power amplifiers; and
providing, by the at least one second T/R RFIC, a second input power less than or equal to a second peak power level to at least one other first power amplifier of the at least two first power amplifiers.

11. The method of claim 6, further comprising:
adjusting, by the at least one first T/R RFIC, the first bias drain voltage applied to the at least two first power amplifiers of the active electronically scanned array; and
adjusting, by the at least one second T/R RFIC, the second bias drain voltage applied to the at least two second power amplifiers of the active electronically scanned array.

12. A system, comprising:
a plurality of transmit/receive modules including:
at least two first transmit/receive modules, each first transmit/receive module including:
at least one first power amplifier; and
at least one first transmit/receive (T/R) radio frequency integrated circuit (RFIC) coupled with the at least one first power amplifier and configured to control a first bias drain voltage applied to the at least one first power amplifier; and
at least two second transmit/receive modules, each second transmit/receive module including:
at least one second power amplifier; and
at least one second T/R RFIC coupled with the at least one second power amplifier and configured to control a second bias drain voltage applied to the at least one second power amplifier, the second bias drain voltage being different from the first bias drain voltage.

13. The system of claim 12, wherein each first transmit/receive module includes at least two first power amplifiers, and wherein the at least one first T/R RFIC is configured to control the first bias drain voltage applied to the at least two first power amplifiers.

14. The system of claim 13, wherein each second transmit/receive module includes at least two second power amplifiers, and wherein the at least one second T/R RFIC is configured to control the second bias drain voltage applied to the at least two second power amplifiers.

15. The system of claim 12, wherein each first transmit/receive module includes at least four first power amplifiers, and wherein the at least one first T/R RFIC is configured to control the first bias drain voltage applied to the at least four first power amplifiers, and wherein each second transmit/receive module includes at least four second power amplifiers, and wherein the at least one second T/R RFIC is configured to control the second bias drain voltage applied to the at least four second power amplifiers.

16. The system of claim 12, further comprising:
at least one first radiating element, each of the at least one first radiating element coupled with a particular first power amplifier of the at least one first power amplifier and configured to receive power from the particular first power amplifier; and
at least one second radiating element, each of the at least one second radiating element coupled with a particular second power amplifier of the at least one second power amplifier and configured to receive power from the particular second power amplifier.

17. The system of claim 12, wherein the at least one first T/R RFIC is further configured to control an input power less than or equal to an identical peak power level provided to the at least one first power amplifier, and wherein the at least one second T/R RFIC is further configured to control an input power less than or equal to the identical peak power level provided to the at least one second power amplifier.

18. The system of claim 12, wherein each first transmit/receive module of the at least two transmit/receive modules includes a plurality of first supporting T/R RFICs, and wherein each of the at least one first power amplifier is implemented within a particular first supporting T/R RFIC of the plurality of first supporting T/R RFICs, and wherein each second transmit/receive module of the at least two transmit/receive modules includes a plurality of second supporting T/R RFICs, wherein each of the at least one second power amplifier is implemented within a particular second supporting T/R RFIC of the plurality of second supporting T/R RFICs.

19. The system of claim 12, wherein the plurality of transmit/receive modules further includes:
- at least two third transmit/receive modules, each third transmit/receive module including:
    - at least one third power amplifier; and
- at least one third T/R RFIC coupled with the at least one third power amplifier and configured to control a third bias drain voltage applied to the at least one third power amplifier, the third bias drain voltage being different from the first bias drain voltage and the second bias drain voltage.

* * * * *